United States Patent
Guthaus et al.

(10) Patent No.: US 10,418,939 B2
(45) Date of Patent: Sep. 17, 2019

(54) LC RESONANT CLOCK RESOURCE MINIMIZATION USING COMPENSATION CAPACITANCE

(71) Applicants: Matthew Guthaus, Santa Cruz, CA (US); Ping-Yao Lin, Santa Cruz, CA (US)

(72) Inventors: Matthew Guthaus, Santa Cruz, CA (US); Ping-Yao Lin, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/522,810

(22) PCT Filed: Oct. 30, 2015

(86) PCT No.: PCT/US2015/058517
§ 371 (c)(1),
(2) Date: Apr. 28, 2017

(87) PCT Pub. No.: WO2016/070154
PCT Pub. Date: May 6, 2016

(65) Prior Publication Data
US 2017/0338772 A1     Nov. 23, 2017

Related U.S. Application Data
(60) Provisional application No. 62/072,506, filed on Oct. 30, 2014.

(51) Int. Cl.
*H01L 23/00* (2006.01)
*H01L 23/31* (2006.01)
(Continued)

(52) U.S. Cl.
CPC ............. *H03B 5/1243* (2013.01); *G06F 1/10* (2013.01); *H01L 23/49838* (2013.01);
(Continued)

(58) Field of Classification Search
CPC .... G06F 1/10; G06F 17/5068; G06F 17/5072; G06F 2217/62; H03K 19/17724;
(Continued)

(56) References Cited

U.S. PATENT DOCUMENTS

2008/0030252 A1    2/2008   Cheng
2013/0154727 A1    6/2013   Guthaus
(Continued)

*Primary Examiner* — Lincoln D Donovan
*Assistant Examiner* — Diana J. Cheng
(74) *Attorney, Agent, or Firm* — Venable LLP; Henry J. Daley; Ryan T. Ward (57) ABSTRACT

VLSI distributed LC resonant clock networks having reduced inductor dimensions as well as simplified decoupling capacitances that are obtained by including one or more compensation capacitors. A compensation capacitor can be added in parallel with a clock capacitance and/or in parallel with a clock inductor. The presence of a compensation capacitance reduces the overhead associated with the inductor and the decoupling capacitor. The compensation capacitor (s) can be selectively switched into the network to create scalable resonant frequencies.

12 Claims, 4 Drawing Sheets

(51) Int. Cl.
*H01L 23/64* (2006.01)
*H01L 25/00* (2006.01)
*H01L 29/94* (2006.01)
*H01L 23/498* (2006.01)
*H03B 5/12* (2006.01)
*G06F 1/10* (2006.01)

(52) U.S. Cl.
CPC .......... *H01L 23/642* (2013.01); *H01L 23/645* (2013.01); *H01L 25/00* (2013.01); *H01L 29/94* (2013.01); *H01L 23/3128* (2013.01); *H01L 23/49816* (2013.01); *H01L 24/16* (2013.01); *H01L 2224/16225* (2013.01); *H01L 2924/1205* (2013.01); *H01L 2924/1206* (2013.01); *H03B 2200/004* (2013.01); *H03B 2200/0082* (2013.01); *H03B 2201/0208* (2013.01)

(58) Field of Classification Search
CPC ...... H03B 7/146; H02M 3/156; H02M 3/158; H02M 1/08; H02M 2001/0025; H02J 50/12; H02J 50/80; H02J 7/025; H03F 2200/451; H03F 3/245; H03F 1/56; H03F 2200/387; H03F 3/195; H05B 33/0815; H05B 33/0842; H05B 33/089; H01L 23/642; H01L 23/645
See application file for complete search history.

(56) References Cited

U.S. PATENT DOCUMENTS

| | | | |
|---|---|---|---|
| 2014/0198417 A1* | 7/2014 | Wang | H02H 9/045 361/56 |
| 2014/0285272 A1 | 9/2014 | Guthaus | |
| 2017/0093369 A1* | 3/2017 | Khlat | H03H 9/6406 |

* cited by examiner

LC RESONANT CLOCK RESOURCE MINIMIZATION USING COMPENSATION CAPACITANCE

FIELD OF THE INVENTION

The presently disclosed subject matter is directed towards clock distribution networks that use distributed inductor-capacitor (LC) resonant tanks. More particularly, the present invention relates to the use of compensation capacitors to reduce the overhead of on-chip tank resources of Very Large Scale Integration (VLSI) clock distribution networks while enabling frequency scaling of resonant clocks.

BACKGROUND OF THE INVENTION

The on-going demand for high performance electronic systems has driven the need for high-speed Very Large Scale Integration (VLSI) chips. VLSI implementations are demand driven to proceed in two inter-related directions: higher performance and higher density (more devices per unit area). While modern VLSI chips have achieved astonishingly high levels of performance and chip density the demand for even higher levels keeps growing.

A serious impediment to achieving higher performance and higher density is power consumption. As a general rule higher performance requires more power, which produces more heat, which increases failure rates which can render VLSI devices unsuitable for some tasks. The result is that power consumption is often the predominant challenge in improving high performance VLSI devices.

Almost all modern VLSI devices are clocked. As long as all gates can keep up the higher the clock rate the faster the performance. As clock rates and VLSI devices densities increase it becomes difficult to ensure that all gates can be properly clocked. One reason for this is that each sequential gate element in a VLSI device needs its own clock signal, but not all sequential gate elements are the same distance from the clock source. This means that all clock lines are not the same length and thus associated parameters such as distributed capacitances and resistances differ between elements. Different lengths coupled with unavoidable signal delays caused by distributed resistances and capacitances can cause clock signals to arrive at different elements at different times. This is referred to as clock skew.

Compounding VLSI clocking problems is that clocking requires power. In fact, the on-chip clock distribution network (CDN) of modern VLSI devices often consume more than 35% of the total device power and can occasionally require as much as 70%. This is expected since dynamic power is determined by:

$$P = \alpha C V^2 f$$

where $\alpha$ is the switching activity, C is the clock distribution network (CDN) capacitance, V is the supply voltage and f is the operating frequency.

Many works have attempted to reduce power consumption by decreasing one or more of these factors, but the savings are often limited during peak activity and the requirement that clock quality must not be degraded.

Figure 1:
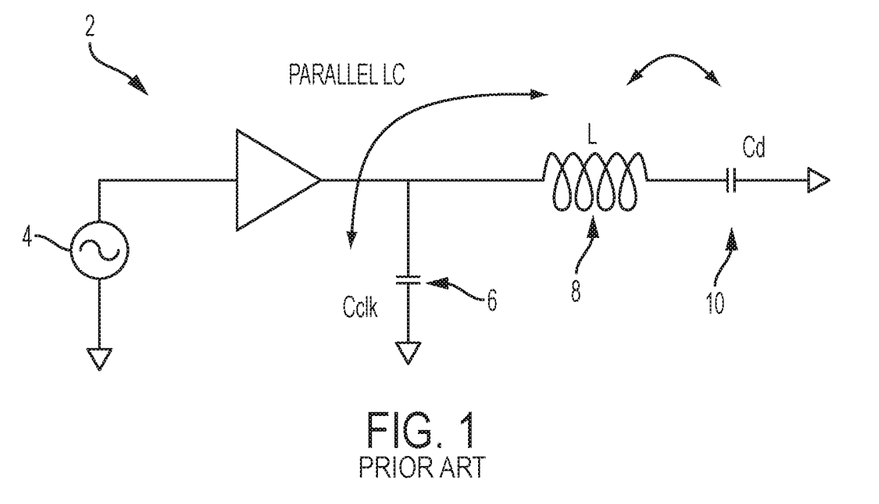
FIG. 1 illustrates a prior art distributed LC resonant clock network 2.

One successful approach to reducing VLSI power consumption is the use of Distributed LC resonant clocks. Referring now to FIG. 1, a distributed LC resonant clock network 2 circumvents problems by oscillating input energy 4 between electrical potentials and magnetic fields using a parallel clock capacitance $C_{clk}$ 6 and an inductance L 8. An additional decoupling capacitance $C_d$ 10 offsets the voltage range to 0-$V_{dd}$ by forming a series LC tank with the inductance L 8.

The approach shown in FIG. 1 has proven the power savings of distributed LC resonant clocks. Distributed LC resonant clocks have also been shown to have stable clock phases and magnitudes when compared to alternative approaches such as standing waves and rotary/salphasic resonant clocks. Academic algorithms have further optimized distributed LC resonant clocks to show the possibility of power savings of up to 90%. Unfortunately, such large power savings come at the expense of relatively large inductors and decoupling capacitors.

Figure 2:
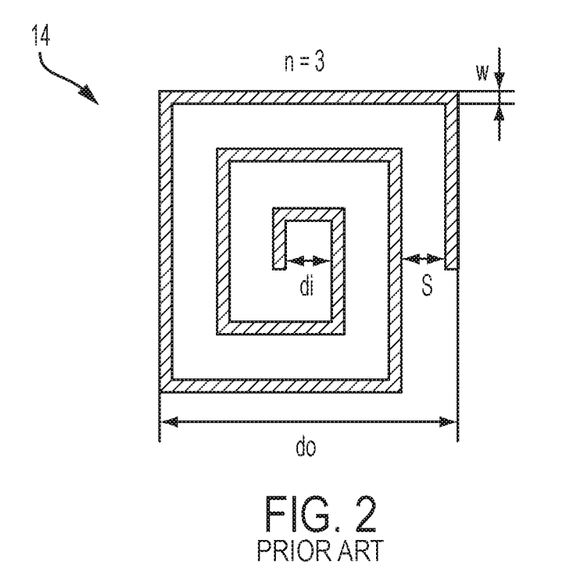
FIG. 2 illustrates a spiral inductor 14 suitable for use in the present invention.

Inductors such as the inductor 8 of FIG. 1 can be readily fabricated on-chip. For example, VLSI spiral inductors can be manufactured on-chip using well-known CMOS processes. For example, high-Q spiral inductors can be fabricated using modern processes with thick (~10 μm) oxides. But, on-chip VLSI inductors come with parasitic resistances and capacitances that decrease the inductor quality factor. But parasitic resistances can be included in the model of the inductor, and parasitic capacitances can be treated as part of the decoupling capacitance in a resonant clock. FIG. 2 shows a square spiral inductor L 14 having an inductance that can be approximated as:

$$L = 0.0002 l \left[ \ln \frac{2l}{w+t} + 0.5 + \frac{w+t}{3l} \right] nH$$

where n is the number of turns, w is the width of a trace, t is the thickness of the metal, l is the length of trace and s is the spacing between turns. Given n, s, w, $d_i$ (inner diameter of the square spiral inductor), $d_o$ (outer diameter of the square spiral inductor) the chip areas occupied by the inductor L 14 is:

$$\text{Area} = d_o^2 = (d_i + 2n(s+w))^2$$

Figure 3:
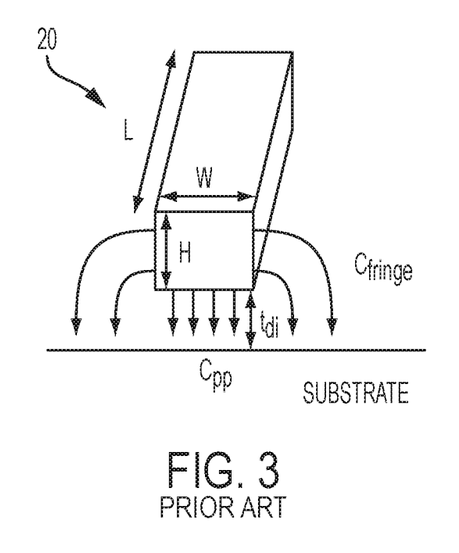
FIG. 3 illustrates a MOS capacitor 20 suitable for use in the present invention.

On-chip capacitors are most effectively created as MOS (metal-oxide-semiconductor) capacitors that have both parallel-plate and fringe-field capacitances as illustrated by capacitor 20 shown in FIG. 3. The capacitance of capacitor 20 can be approximated as:

$$C = C_{pp} + C_{fringe} = \frac{e_{di}}{t_{di}} WL + \frac{2\pi e_{di}}{\log\left(\frac{t_{di}}{H}\right)}$$

where W and L are the width and length of the metal representing the area of the capacitor, H is the height of the metal, and $\varepsilon_{di}$ and $t_{di}$ are the permittivity and thickness of the dielectric layer. In the case of $SiO_2$, $\varepsilon_{di} = \varepsilon_r$, $\varepsilon_0 = 3.9 \times 8.854 \times 10^{-12}$ F/m, where $\varepsilon_r$ is the relative permittivity of the insulating material, and $\varepsilon_o$ is the permittivity of free space.

As the W/H ratio reduces below unity the fringing capacitance of the capacitor 20 becomes dominate and significantly contributes to the overall capacitance. In a modern 90 nm CMOS technology, a MOS capacitor 20 can reach a capacitive density of 10~20 fF/μm².

These on-chip VLSI inductors and capacitors can be used to form a series or parallel LC "tank" circuit which resonates at a particular frequency. The resonant frequency $f_r$ of an ideal LC tank is the frequency when the network has zero total reactance. The resonant frequency of a tank (C and L) is ideally:

$$fr = \frac{1}{2\pi\sqrt{LC}}$$

When the impedance of the LC tank is near infinite due to the reactances cancelling the drive capability requirement of the clock buffer is minimized and clock energy can be saved.

Referring once again to FIG. 1, the resonant clock topology contains two LC tanks: one parallel and one series. The parallel LC tank ideally has infinite impedance at resonance while the series impedance ideally has zero impedance. These tanks would counteract each other if they resonate at the same frequency. Therefore, the decoupling capacitor $C_d$ 10 is typically much larger than $C_{clk}$ 6 to separate the resonant frequencies of the parallel $LC_{clk}$ and extra series $LC_d$ tanks according to $$\tfrac{1}{2}\pi\sqrt{LC_d} \ll \tfrac{1}{2}\pi\sqrt{LC_{clk}}$$

This ensures a wide margin such as $f_{clk}/f_d\sim 3$ by making $C_d$ 10 for example 10 times $C_{clk}$ 6 or more. The magnitude at the resonant frequency, $w_0=2\pi f_0$ is referred to as the characteristic impedance of the distributed LC resonant clock network 2.

In practice, the inductor L 8 area is the most significant obstacle to widespread acceptance of distributed LC resonant clock networks. Another problem is that the decoupling capacitance $C_d$ 10 represents an extra burden on that acceptance. Reducing the inductor area and simplifying the decoupling capacitance would be highly beneficial and would make distributed LC resonant clock networks more practical.

Another issue with the wide spread acceptance of distributed LC resonant clock networks is achieving a configurable frequency of operation without significant efficiency degradation. Frequency scaling would be highly advantageous.

Therefore a distributed LC resonant clock network having reduced inductor dimensions would be beneficial. Even more beneficial would be a distributed LC resonant clock network having a simplified decoupling capacitance. Ideally such a distributed LC resonant clock network ideally would enable scalable frequency resonant clocks.

BRIEF SUMMARY OF THE INVENTION

The present invention discloses an LC resonant clock network having a compensation capacitor $C_c$ in parallel with a capacitor $C_{clk}$ and/or in parallel with an inductor. Those compensation capacitors can be permanently placed in parallel or switched into place.

The principles of the present invention provide for distributed LC resonant clock networks having reduced inductor dimensions as well as simplified decoupling capacitances. Furthermore, the principles of the present invention provide for scalable frequency distributed LC resonant clock networks.

A distributed LC resonant clock network in accord with the present invention minimizes inductor and capacitor overhead using and added coupling capacitor. That added coupling capacitor also enables scalable frequency.

A VLSI clock distribution network in accord with the present invention includes a VLSI substrate, a clock distribution capacitor $C_{clk}$ fabricated on the VLSI substrate and having a lead that is connected to ground and an open lead.

A decoupling capacitor $C_d$ is also fabricated on the VLSI substrate as is a clock distribution inductor L. The inductor L connects to the open lead and to the decoupling capacitor. A buffer is also fabricated on the VLSI substrate with the buffer driving the capacitor $C_{clk}$ and the inductor L at a clock frequency. A compensation capacitor $C_c$ is in parallel with the capacitor $C_{clk}$. The clock distribution network is resonant at a clock frequency set by:

$$f'_{clk} = \frac{1}{2\pi}\sqrt{\frac{C_{clk}+C_c+C_d}{L(C_{clk}+C_d)C_d}}.$$

The capacitor $C_{clk}$, the capacitor $C_d$, and/or the capacitor $C_c$ are fabricated as MOS capacitors. The inductor L is beneficially a spiral wound inductor having an inductance approximately equal to:

$$L = 0.0002\, l\left[\ln\frac{2l}{w+t} + 0.5 + \frac{w+t}{3l}\right] nH.$$

Another VLSI clock distribution network that is in accord with the present invention includes a VLSI substrate, a clock distribution capacitor $C_{clk}$ fabricated on the VLSI substrate and having a lead that is connected to ground and an open lead. A decoupling capacitor $C_d$ is also fabricated on the VLSI substrate as is a clock distribution inductor L. The inductor L connects to the open lead and to the decoupling capacitor. A buffer is also fabricated on the VLSI substrate with the buffer driving the capacitor $C_{clk}$ and the inductor L. A compensation capacitor Cc is in parallel with the inductor L. The clock distribution network is resonant at the clock frequency which is determined as:

$$f'_{clk} = \frac{1}{2\pi}\sqrt{\frac{C_{clk}+C_d}{L[C_{clk}C_d+C_c(C_{clk}+C_d)]}}.$$

The capacitor $C_{clk}$, the capacitor $C_d$, and/or the capacitor $C_c$ are fabricated as MOS capacitors. The inductor L is beneficially a spiral wound inductor having an inductance approximately equal to:

$$L = 0.0002\, l\left[\ln\frac{2l}{w+t} + 0.5 + \frac{w+t}{3l}\right] nH.$$

Another VLSI clock distribution network that is in accord with the present invention includes a VLSI substrate, a clock distribution capacitor $C_{clk}$ fabricated on the VLSI substrate and having a lead connected to ground and an open lead. A decoupling capacitor $C_d$ is fabricated on the along with a clock distribution inductor L. The inductor L is connected to the open lead and to the decoupling capacitor. A buffer is also fabricated on the VLSI substrate. The buffer drives the capacitor $C_{clk}$ and the inductor L at a clock frequency. The VLSI clock distribution network further includes a first compensation capacitor $C_{c1}$ that is connected to ground and a first pass switch that is disposed between the first compensation capacitor $C_{c1}$ and the lead. The selectable resonant frequency changes when the first pass switch closes.

The frequency scalable VLSI clock distribution network may also include a second pass switch and a second compensation capacitor that are in series. The series combination of the second pass switch and the capacitor $C_{c2}$ are in parallel with the inductor L. The selectable resonant frequency changes when the second pass switch closes.

BRIEF DESCRIPTION OF THE DRAWINGS

The advantages and features of the present invention will become better understood with reference to the following detailed description and claims when taken in conjunction with the accompanying drawings, in which like elements are identified with like symbols, and in which:

DETAILED DESCRIPTION OF THE INVENTION

The presently disclosed subject matter now will be described more fully hereinafter with reference to the accompanying drawings in which one embodiment is shown. However, it should be understood that this invention may take different forms and thus the invention should not be construed as limited to the specific embodiment set forth herein.

All publications mentioned herein, specifically including "DISTRIBUTED RESONANT CLOCK GRID SYNTHESIS," a patent application 61/502,626 filed on Jun. 22, 2011 having inventors Dr. Matthew Guthaus and Xuchu Hu, are incorporated by reference for all purposes to the extent allowable by law.

In addition, in the figures like numbers refer to like elements throughout. Additionally, the terms "a" and "an" as used herein do not denote a limitation of quantity, but rather denote the presence of at least one of the referenced items.

Figure 7:
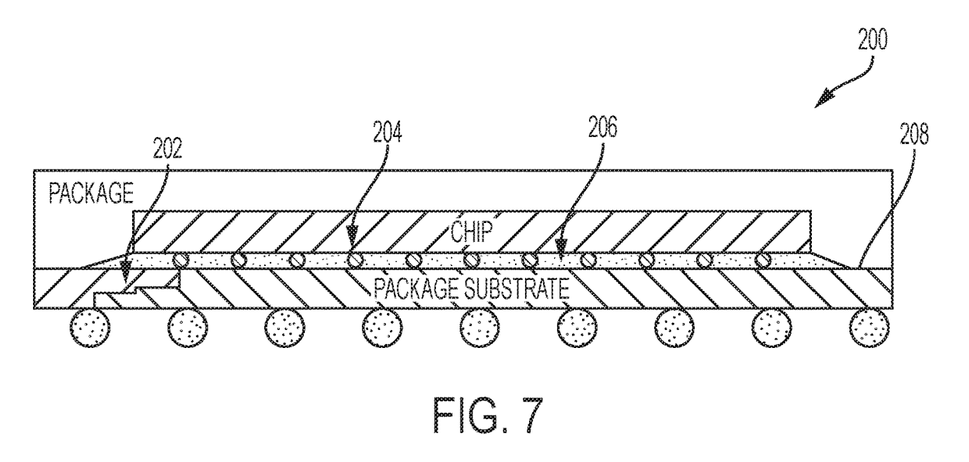
FIG. 7 illustrates a VLSI device 200 including a VLSI chip that carries LC resonant clocks in accord with the present invention.

FIG. 7 illustrates a VLSI device 200 including a VLSI chip 204. The VLSI device 200 further includes a protective package 202 that spaces the VLSI chip 204 above internal contacts (shown as ball contacts) as well as external ball contacts 208. The VLSI chip 204 is suitable for carrying the LC resonant tanks that form the VLSI clocks.

Figure 4:
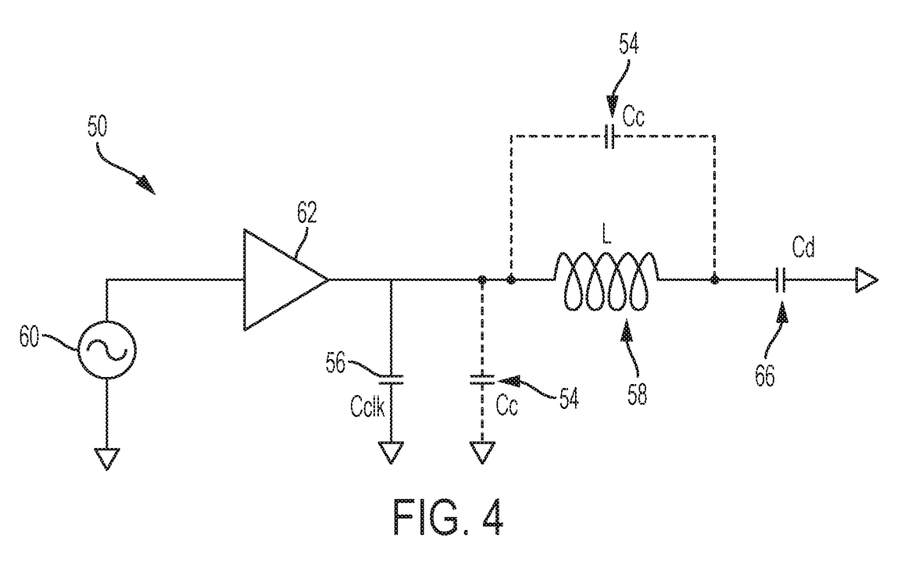
FIG. 4 is a schematic depiction of a distributed LC resonant clock network 50 that is in accord with the present invention.

FIG. 4 illustrates a distributed LC resonant clock network 50 that is in accord with the present invention and which illustrates two different topologies for insertion of a compensation capacitance $C_c$ 54. One position is in parallel with $C_{clk}$ 56 while the other in parallel with L 58. In addition, FIG. 4 includes a signal source 60 operating at $f_0$, an amplifier 62, and a decoupling capacitor $C_d$ 66.

If $C_c$ 54 is in parallel with $C_{clk}$ 56 the size of the inductance L 58 can be reduced to obtain the same frequency $f_0$ according to the formula:

$$f_0 = \frac{1}{2\pi\sqrt{LC}}$$

Figure 5:
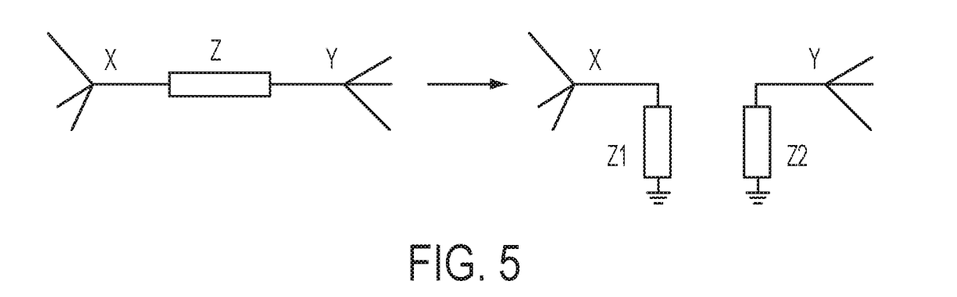
FIG. 5 illustrates the Miller Effect in distributed LC resonant clock network 50.

However, if $C_c$ 54 is in parallel with L 58 the often undesired Miller Effect can be used to good effect. Its application is shown in FIG. 5 which suggests that $C_c$ 54 can be divided as $C_{c1}$ and $C_{c2}$ in parallel with, and thus adding to $C_{clk}$ 56 and $C_d$ 66, respectively. This reduces the size of both L 58 and $C_d$ 66 to obtain the same operating frequency $f_0$. In this manner the impact of a relatively small capacitor can be magnified to great advantage in distributed LC resonant clock network while still retaining the required very high frequency operation.

If both the parallel and series tank circuits are considered in the distributed LC resonant clock network 2 of FIG. 1 the resonant clock frequency becomes:

$$f_{clk} = \frac{1}{2\pi}\sqrt{\frac{C_{clk} + C_d}{LC_{clk}C_d}}$$

If as usual $C_d = 10 C_{clk}$ this reduces to:

$$f_{clk} = \sqrt{\frac{11}{10}} \times \frac{1}{2\pi\sqrt{LC_{clk}}}$$

The result is a 4.9% increase in resonant frequency due to the parasitic series $LC_d$ tank. That fact alone can be utilized to reduce the required inductor size of L 58 and save area at a fixed frequency $f_0$.

Referring again to FIG. 4, if $C_c$ 54 is added in parallel with $C_{clk}$ 56 the resonant frequency will add $C_c$ 54 to $C_{clk}$ 54 to give a resonant frequency of:

$$f'_{clk} = \frac{1}{2\pi}\sqrt{\frac{C_{clk} + C_c + C_d}{L(C_{clk} + C_d)C_d}}$$

The result is a decrease in resonant frequency given by:

$$\frac{f'_{clk}}{f_{clk}} = \sqrt{\frac{1 + \frac{C_c}{C_{clk} + C_d}}{1 + \frac{C_c}{C_{clk}}}}$$

Now if $C_c$ 54 is added in parallel with L 58 the resonant frequency is:

$$f'_{clk} = \frac{1}{2\pi}\sqrt{\frac{C_{clk} + C_d}{L[C_{clk}C_d + C_c(C_{clk} + C_d)]}}$$

The result is a decrease in resonant frequency found by.

$$\frac{f'_{clk}}{f_{clk}} = \sqrt{\frac{1}{1 + \frac{C_c}{C_{clk}} + \frac{C_c}{C_d}}}$$

This result is even better as far as reducing the size of the inductor than putting $C_c$ in parallel with $C_{clk}$ 56.

A specific example may be helpful. If $C_c=0.5 \times C_{clk}$ and $C_d=10 \times C_{clk}$, then the resulting clock $f'_{clk}$ given $C_c$ 54 is in parallel with $C_{clk}$ 56 in FIG. 4 is:

$$f_{clk} = \sqrt{\frac{11}{15}} \div 2\pi\sqrt{LC_{clk}}$$

Now, if Cc 54 is in parallel with L 58 then:

$$f_{clk} = \sqrt{\frac{11}{15.5}} \div 2\pi\sqrt{LC_{clk}}$$

This suggests that in the tank network of FIG. 4 that $f'_{clk}$ when $C_c$ 54 is in parallel with L 58 has a 3.8% lower frequency (in this example) than when in parallel with $C_{clk}$ 56. Again, this can be used to reduce the size of the inductor L 58.

Still referring to FIG. 4 while taking into consideration of the Miller Effect in FIG. 5, a significant difference in the topologies is the addition of $C_{c2}$ to $C_d$ 66 when the compensation capacitor $C_c$ 54 is in parallel with L 58. In this case, the decoupling resonant frequency is:

$$f_d = \frac{1}{2\pi\sqrt{L(Cd+C_c)}}$$

which is a factor $$\frac{1}{\sqrt{C_c}}$$

lower than the case without $C_c$ 54. Consequently, it offers the advantage of sharing $C_c$ 54 directly from $C_d$ 66 for the same $f_d$.

Based on the basic resonant frequency formula:

$$f_0 = \frac{1}{2\pi\sqrt{LC}}$$

L 58 can be reduced by adding $C_c$ 54 and considering the Miller Approximation to get $C_{c1}$ and $C_{c2}$. If $C_{c1}+C_{clk}=\alpha_{1x}C_{clk}$, where $\alpha_1$ is the ratio or capacitive effect between $C_{c1}+C_{clk}$ and $C_{clk}$, then L 58 can be reduced as $L \times \alpha_1$ for the same resonant frequency. The result is:

$$L' = \frac{L}{\alpha_1} = \frac{L}{\left(\frac{f_{clk}}{f'_{clk}}\right)^2}$$

$\alpha 1$ therefore represents the capacitive effect between $C_{c1}$, while L' and $f'_{clk}$ are the inductance and resonant frequency after adding the effect of $C_c$ 54. A higher $\alpha 1$ means a better capacitive effect and a lower resonant frequency $f'_{clk}$.

Experimental results confirm the foregoing. Smaller inductors L 58 can be used to produce a fixed resonant frequency $f_0$ by incorporating a compensation capacitance $C_c$ 54 in parallel with $C_{clk}$ 56 with L 58, or with both. In addition, a fixed inductor L 58 and fixed $C_{clk}$ 56 can be used to produce a scaled frequency by incorporating $C_c$ 54 in parallel with $C_{clk}$ 56, with L 58, or with both. Significant on-chip area can be saved by incorporating $C_c$ 54. All of these results are highly beneficial and useful when incorporating distributed LC resonant clocks.

Incorporating compensation capacitors $C_c$ 54 also enables dynamic frequency scaling. This enables a new, useful and unobvious enhancement to distributed LC resonant clocks.

Figure 6:
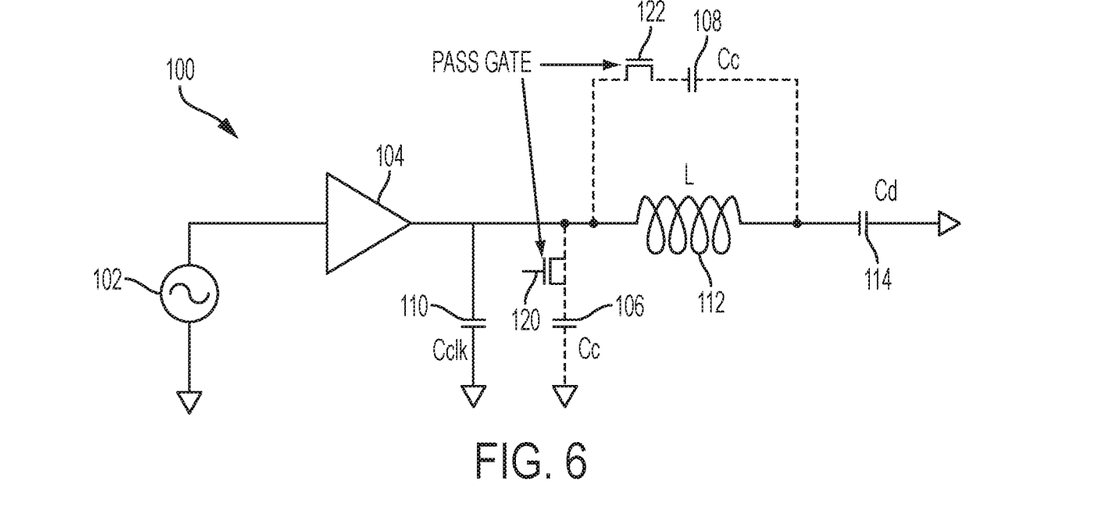
FIG. 6 illustrates a distributed LC resonant clock network 100 that provides for selectable frequency scaling.

Reference FIG. 6 for a distributed LC resonant clock network 100 suitable for selectable frequency scaling. The distributed LC resonant clock network 100 includes a signal source 102 that operates at $f_0$, an amplifier 104, a first compensation capacitor $C_c$ 106, a second compensation capacitor $C_c$ 108, a capacitor $C_{clk}$ 110, an inductor L 112 and a decoupling capacitor $C_d$ 114. In addition, the distributed LC resonant clock network 100 includes a first pass switch 120 and a second pass switch 122 for selectively connecting the first and second compensation capacitors $C_c$ 106, 108, respectively into the network 100.

The distributed LC resonant clock network 100 enables multiple selectable (i.e. scalable) resonant frequencies selected by enabling or disabling the first pass switch 120 and the second pass switch 122. The selectable (scalable) resonant frequencies are selected in accord with the frequencies provide above. Both compensation capacitors $C_c$ 106, 108 can be disabled, resulting in the resonant frequency provided above without the use of compensation capacitances. If only compensation capacitor Cc 106 is enabled by turning on pass switch 120 the result is the resonant frequency provided above with a compensation capacitor $C_c$ 106 in parallel with $C_{clk}$ 110. Compensation capacitor $C_c$ 108 could be enabled by turning on pass switch 122, resulting in the resonant frequency provided above with compensation capacitor $C_c$ 108 in parallel with L. Both compensation capacitors $C_c$ 106, 108 could be enable by turning on pass switches 120, 122, resulting in the resonant frequency provided above with compensation capacitors $C_c$ 106, 108 in parallel with both $C_{clk}$ and L. Four different selectable resonant frequencies can be selected by selectively turning on pass transistors 120 and 122.

It is to be understood that while the figures and the above description illustrates the present invention, they are exemplary only. They are not intended to be exhaustive or to limit the invention to the precise forms disclosed, and obviously many modifications and variations are possible in light of the above teaching. Others who are skilled in the applicable arts will recognize numerous modifications and adaptations of the illustrated embodiments that remain within the principles of the present invention. Therefore, the present invention is to be limited only by the appended claims.

The invention claimed is:

1. A VLSI clock distribution network, comprising:
   a VLSI substrate;
   a clock distribution capacitor $C_{clk}$ fabricated on said VLSI substrate, said capacitor $C_{clk}$ having a lead connected to ground and an open lead;
   a decoupling capacitor $C_d$ fabricated on said VLSI substrate;
   a clock distribution inductor L fabricated on said VLSI substrate, said inductor L connected to said open lead and to said decoupling capacitor;
   a buffer fabricated on said VLSI substrate, said buffer driving said capacitor $C_{clk}$ and said inductor L at a clock frequency; and
   a compensation capacitor $C_c$ in parallel with said capacitor $C_{clk}$;
   wherein said clock distribution network is resonant at said clock frequency, and wherein said clock frequency is determined as:

$$f'_{clk} = \frac{1}{2\pi}\sqrt{\frac{C_{clk}+C_c+C_d}{L(C_{clk}+C_d)C_d}}.$$

2. The VLSI clock distribution network according to claim 1, wherein said capacitor $C_{clk}$ is fabricated as a MOS capacitor.

3. The VLSI clock distribution network according to claim 1, wherein said capacitor $C_d$ is fabricated as a MOS capacitor.

4. The VLSI clock distribution network according to claim 1, wherein said capacitor $C_c$ is fabricated as a MOS capacitor.

5. The VLSI clock distribution network according to claim 1, wherein said inductor L is a spiral wound inductor.

6. The VLSI clock distribution network according to claim 1, wherein said inductor L has an inductance approximately equal to:

$$L = 0.0002\,l\left[\ln\frac{2l}{w+t}+0.5+\frac{w+t}{3l}\right]nH.$$

7. A VLSI clock distribution network, comprising:
   a VLSI substrate;
   a clock distribution capacitor $C_{clk}$ fabricated on said VLSI substrate, said capacitor $C_{clk}$ having a lead connected to ground and an open lead;
   a decoupling capacitor $C_d$ fabricated on said VLSI substrate;
   a clock distribution inductor L fabricated on said VLSI substrate, said inductor L connected to said open lead and to said decoupling capacitor;
   a buffer fabricated on said VLSI substrate, said buffer driving said capacitor $C_{clk}$ and said inductor L at a clock frequency; and
   a compensation capacitor $C_c$ in parallel with said inductor L;
   wherein said clock distribution network is resonant at said clock frequency, and wherein
   said clock frequency is determined as:

$$f'_{clk} = \frac{1}{2\pi}\sqrt{\frac{C_{clk}+C_d}{L[C_{clk}C_d+C_c(C_{clk}+C_d)]}}.$$

8. The VLSI clock distribution network according to claim 7, wherein said capacitor $C_{clk}$ is fabricated as a MOS capacitor.

9. The VLSI clock distribution network according to claim 8, wherein said capacitor $C_d$ is fabricated as a MOS capacitor.

10. The VLSI clock distribution network according to claim 8, wherein said capacitor $C_c$ is fabricated as a MOS capacitor.

11. The VLSI clock distribution network according to claim 7, wherein said inductor L is a spiral wound inductor.

12. The VLSI clock distribution network according to claim 7, wherein said inductor L has an inductance approximately equal to:

$$L = 0.0002\,l\left[\ln\frac{2l}{w+t}+0.5+\frac{w+t}{3l}\right]nH.$$

* * * * *